(12) United States Patent
Tang et al.

(10) Patent No.: US 11,538,687 B2
(45) Date of Patent: Dec. 27, 2022

(54) FLUORINE ION IMPLANTATION SYSTEM WITH NON-TUNGSTEN MATERIALS AND METHODS OF USING

(71) Applicant: ENTEGRIS, INC., Billerica, MA (US)

(72) Inventors: Ying Tang, Brookfield, CT (US); Sharad N. Yedave, Danbury, CT (US); Joseph R. Despres, Middletown, CT (US); Joseph D. Sweeney, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 268 days.

(21) Appl. No.: 16/713,189

(22) Filed: Dec. 13, 2019

(65) Prior Publication Data

US 2020/0194265 A1 Jun. 18, 2020

Related U.S. Application Data

(60) Provisional application No. 62/806,365, filed on Feb. 15, 2019, provisional application No. 62/780,222, (Continued)

(51) Int. Cl.
| | |
|---|---|
| *H01L 21/265* | (2006.01) |
| *H01J 37/317* | (2006.01) |
| *H01J 37/32* | (2006.01) |

(52) U.S. Cl.
CPC .... *H01L 21/26513* (2013.01); *H01J 37/3171* (2013.01); *H01J 37/32055* (2013.01);
(Continued)

(58) Field of Classification Search
CPC ............. H01L 21/26513; H01L 21/265; H01L 21/2658; H01J 37/3171; H01J 37/32055;
(Continued)

(56) References Cited

U.S. PATENT DOCUMENTS

| | | |
|---|---|---|
| 5,640,020 A | 6/1997 | Murakoshi |
| 7,518,124 B2 | 4/2009 | Goldberg |

(Continued)

FOREIGN PATENT DOCUMENTS

| | | | |
|---|---|---|---|
| CN | 104147694 A | * 11/2014 | ........... A61N 1/0428 |
| CN | 104147694 A | 11/2014 | |

(Continued)

OTHER PUBLICATIONS

S. Yedave, et al., Fluorine Beam Performance of Fluoride Dopant Gases and Their Gas Mixtures, 2018, 22nd International Conference on Ion Implantation Technology (IIT), 2018, pp. 231-234.

(Continued)

*Primary Examiner* — Edward Chin (57) ABSTRACT

A system and method for fluorine ion implantation is described, which includes a fluorine gas source used to generate a fluorine ion species for implantation to a subject, and an arc chamber that includes one or more non-tungsten materials (graphite, carbide, fluoride, nitride, oxide, ceramic). The system minimizes formation of tungsten fluoride during system operation, thereby extending source life and promoting improved system performance. Further, the system can include a hydrogen and/or hydride gas source, and these gases can be used along with the fluorine gas to improve source lifetime and/or beam current.

19 Claims, 6 Drawing Sheets

Related U.S. Application Data filed on Dec. 15, 2018, provisional application No. 62/780,219, filed on Dec. 15, 2018.

(52) U.S. Cl.
CPC .. *H01J 37/32449* (2013.01); *H01J 37/32467* (2013.01); *H01L 21/265* (2013.01); *H01J 2237/3365* (2013.01)

(58) Field of Classification Search
CPC ........... H01J 37/32449; H01J 37/32467; H01J 2237/3365; H01J 2237/006; H01J 37/08
See application file for complete search history.

(56) References Cited

U.S. PATENT DOCUMENTS

| | | | |
|---|---|---|---|
| 7,932,539 | B2 | 4/2011 | Chen |
| 7,943,204 | B2 | 5/2011 | Olander |
| 10,989,724 | B1 * | 4/2021 | Holmes ................. G01N 35/02 |
| 2003/0127049 | A1 | 7/2003 | Han |
| 2010/0084687 | A1 | 4/2010 | Chen |
| 2011/0259366 | A1 | 10/2011 | Sweeney |
| 2012/0058252 | A1 * | 3/2012 | Sweeney ................. C23C 14/48 |
| | | | 134/31 |
| 2015/0179393 | A1 | 6/2015 | Colvin |
| 2015/0206701 | A1 * | 7/2015 | Schaller ................. H01J 37/09 |
| | | | 250/505.1 |
| 2015/0248992 | A1 | 9/2015 | Sinha |
| 2015/0357152 | A1 | 12/2015 | Jones |
| 2016/0211137 | A1 | 7/2016 | Tang |
| 2017/0330725 | A1 | 11/2017 | Colvin |
| 2017/0330726 | A1 | 11/2017 | Chambers |
| 2017/0330756 | A1 | 11/2017 | Kaim |
| 2017/0338075 | A1 | 11/2017 | Byl |
| 2018/0211839 | A1 | 7/2018 | Byl |
| 2020/0181771 | A1 * | 6/2020 | Wu ................... C23C 16/45555 |

FOREIGN PATENT DOCUMENTS

| | | | | |
|---|---|---|---|---|
| EP | 3091560 | A1 * | 11/2016 | ............. C23C 14/22 |
| JP | 2001167707 | A | 6/2001 | |
| JP | 4908767 | B2 * | 4/2012 | |
| WO | 2008128039 | A2 | 10/2008 | |
| WO | 2011056515 | A2 | 5/2011 | |
| WO | 2015095692 | A1 | 6/2015 | |
| WO | 2017079588 | A1 | 5/2017 | |

OTHER PUBLICATIONS

Freer et al., Germanium Operation on the GSDIII/LED and Ultra High Current Ion Implanters, Axcelis Technologies, Inc., Proceedings of the 14th International Conference on Ion Implantation Technology, pp. 420-423, 2002, XP031962082 DOI: 10.1109/IIT.2002.1258030, ISBN: 978-0-7803-7155-2.

Hsieh et al., Exemplary Ion Source for the Implanting of Halogen and Oxygen Based Dopant Gases, 21st International Conference On Ion Implantation Technology (IIT), IEEE, Axcelis Technologies, Inc., pp. 1-4, XP033080341, 2016 DOI: 10.1109/IIT.2016.7882870.

Tang et al., Investigation of Various GeF4 Gas Mixtures for Improvement of Germanium Ion Implantation, 2018 22nd International Conference On Ion Implantation Technology (IIT), IEEE, pp. 211-214, 2018, XP033602548 DOI: 10.1109/IIT.2018.8807896 ISBN: 978-1-5386-6828-3.

Werninghaus et al., Improving Material Choices for Advanced Semiconductor Processing, 2016 21st International Conference On Ion Implantation Technology (IIT), IEEE, Sep. 26, 2016, pp. 1-4, 2016, XP033080352 DOI: 10.1109/IIT.2016.7882881.

* cited by examiner

FLUORINE ION IMPLANTATION SYSTEM WITH NON-TUNGSTEN MATERIALS AND METHODS OF USING

FIELD

The present disclosure relates to fluorine ion implantation systems and methods that utilize non-tungsten materials for controlling halogen cycle, enhancing performance, and extending system life.

BACKGROUND

Fluorine co-implantation is used in advanced semiconductor device manufacturing for defect engineering, shallow junction formation, and material modification. A common setup for fluorine implantation includes feeding a fluoride dopant source gas into the ion source to provide fluorine (F) as one of the dissociation byproducts.

However, conventional fluorine implant processes are generally limited with regards to the type of fluorine ion implanted and the specificity of fluorine ion implantation, such as with regards to fluorine ion implantation depth. Further, ionic species generated upon decomposition of the fluorine-containing compound may also be undesirably co-implanted with the fluorine.

Also, use of fluorine containing feed gases creates a halogen cycle which can negatively impact ion source performance, source life, implant tool productivity and cost of tool ownership. Various challenges in art remain for improving fluorine ion beam performance considering its broad potential applications.

SUMMARY

The current invention relates to systems and methods for implanting fluorine ionic species into a substrate in an ion implantation process. The system includes non-tungsten materials in the arc chamber which, in turn, minimize formation of tungsten fluoride during system operation, otherwise resulting from reaction of fluoride gases with tungsten chamber materials. As such, unwanted tungsten or tungsten fluoride coating can be minimized thereby extending source life and promoting improved system performance. Further, the system can include a hydrogen and/or hydride gas source, and these gases can be used along with the fluorine gas to improve source lifetime and/or beam current.

In one aspect, the invention provides a system for implanting fluorine ion species into a substrate, with the system including a gas source comprising a fluorine compound, wherein the fluorine compound is capable of generating at least one fluorine ion species when ionized. The system also includes an arc chamber formed from one or more (non-tungsten) materials a graphite-containing material, a carbide-containing material, a fluoride-containing material, a nitride-containing material, a oxide-containing material, or a ceramic. In exemplary aspects, these non-tungsten materials can be non-graded, surface graded, or surface coated, on an arc chamber liner(s) or arc chamber piece(s).

In another aspect, the invention also provides a method for implanting one or more fluorine ion species into a substrate, the method including steps of providing a system as described herein, wherein a substrate is present in the process chamber; and then operating the system to implant the one or more fluorine ion species into the substrate.

The fluorine ion species can be generated from one or more fluorine-containing compounds including those such as F2 and various other compounds having one or more element(s) capable of forming a bond with fluorine.

The system and method of the invention can also include one or more of the following features: a hydrogen- or hydride-containing gas source, an oxygen-containing gas source, and/or an inert gas source. In some embodiments, the fluorine-containing gas is co-flowed with one or more of the hydrogen-containing gas, the oxygen-containing gas, and/or the inert gas individually. In some embodiment, two of more of the fluorine-containing gas, the hydrogen-containing gas, the oxygen-containing gas, and/or the inert gas are in pre-mixture in a gas cylinder package. In some embodiments, two of more of the fluorine-containing gas, the hydrogen-containing gas, the oxygen-containing gas, and/or the inert gas are co-flowed together. Use of one or more of these gases that are different than the fluorine compound can improve implant beam current, source life performance, or both.

DETAILED DESCRIPTION

The present disclosure relates to fluorine ion implantation, and in various aspects to methods and systems in which a fluorine compound is used that generates a plurality of fluorine ionic species, and the system is operated to provide a predetermined flow rate of the fluorine compound, a predetermined arc power, and predetermined source magnetic field. The operating conditions provide an optimized beam current for a desired fluorine ion species, which in turn can be targeted for implantation into a substrate.

Methods of the disclosure can be performed using an ion source apparatus for ion implantation. Any type of ion implantation system can be used for the fluorine implantation methods as described herein. The system that includes an arc chamber formed from one or more materials comprising a graphite-containing material, a carbide-containing material, a fluoride-containing material, a nitride-containing material, an oxide-containing material, or a ceramic. The presence of these materials in the chamber can replace tungsten, and can improve the F+ implant performance, including beam current and source life. In particular, these materials can reduce the amount of tungsten fluoride formed during an implantation process.

One or more of these non-tungsten materials (a graphite-containing material, a carbide-containing material, a fluoride-containing, a nitride-containing, an oxide-containing material, or a ceramic) can be present in all or a portion of one or more of arc chamber liner(s) or arc chamber piece(s).

One or more of the non-tungsten materials can be integrated into the structural material of the arc chamber. For example, an arc chamber material can be "surface graded" (e.g, "infused") with a graphite-containing, carbide-containing, fluoride-containing, a nitride-containing, or oxide-containing materials, or with a ceramic. In some modes of practice, surface grading is achieved by applying a desired non-tungsten material (graphite, carbide, etc.) to the metal surface and then heating the surface to integrate the non-tungsten material into the metal of the arc chamber. The non-tungsten material becomes present at high density at the surface of the structure and can provide a protective barrier. Surface grading can be over all or a portion of the surface (interior) of the arc chamber.

Alternatively, the arc chamber can be non-graded but otherwise modified to associate the desired non-tungsten material with material of the arc chamber. For example, in another mode of modification, a desired non-tungsten material (graphite, carbide, etc.) is surface coated on all or a portion of the metal surface of the arc chamber. In a surface coating the non-tungsten material forms a coated layer on the metal surface, but is not necessarily integrated into the metal. The coated layer can be formed by one of a variety of techniques such as coating the non-tungsten material using heat, coating using pressure, or by sputter coating. The coated layer can be of a desired thickness, such as 1 nanometer to 5 milimeter. Surface coating can be over all or a portion of the surface (interior) of the arc chamber.

As yet another embodiment, system can include a structural member including a non-tungsten material disposed in the ion source chamber, such as a non-tungsten liner or other structural components of the ion source chamber. A liner may be a flat, e.g., planar piece of structure having two opposed major surfaces and a thickness therebetween. A liner may be rectangular, curved (e.g., rounded), angular, or otherwise shaped. A liner can be removable, meaning that the liner can be inserted and removed from the interior space of the ion source chamber. In other cases a liner can be permanent and non-removable from the chamber. An insertable liner can be formed from any one or more of a graphite-containing material, a carbide-containing material, a fluoride-containing material, a nitride-containing material, an oxide-containing material, or a ceramic, as described herein.

Various types of non-tungsten materials can be used to modify the arc chamber. For example, the graphite-containing material, the carbide-containing material, a fluoride-containing, a nitride-containing, a oxide-containing material, or the ceramic are selected from the group consisting of graphite (C), silicon carbide (SiC), tungsten carbide (WC), tungsten boride (WB, $W_2B$, $WB_2$, $WB_4$), boron carbide ($B_4C$, $B_{12}C_3$), aluminum carbide ($Al_4C_3$), magnesium carbide ($Mg_2C$), aluminum fluoride ($AlF_3$), gallium fluoride($GaF_3$), indium fluoride ($InF_3$), boron nitride (BN), gallium nitride (GaN), aluminum nitride (AlN), tungsten lanthanum oxide ($WLa_2O_3$), gallium oxide ($Ga_2O_3$), aluminum oxide ($Al_2O_3$).

In some embodiments, the graphite-containing material, the carbide-containing material, or the ceramic can be PLS (10 micron graphite), DFP (5 micron graphite), DFP3-2 (densified graphite), SCF (hard graphite), SCF-PYC (hard 5 micron graphite with pyrocarbon coating), SCF-IF (hard 5 micron graphite with pyrocarbon infiltration), ZEE (hard 1 micron graphite), ZEE-PYC (hard 1 micron graphite with pyrocarbon coating), ZEE-IF(hard 1 micron graphite with pyrocarbon infiltration), SUPERSiC, SUPERSiC-GS (graphite with SiC composite layer), of a combination of any two or more of these materials.

In the system of disclosure, the arc chamber can includes an interior defined by interior surfaces that include sidewalls, a bottom, and a top, wherein all or a portion of the interior surfaces comprise the graphite-containing material, the carbide-containing material, the fluoride-containing material, the nitride-containing material, the oxide-containing material, or the ceramic; and the sidewalls mentioned above includes the sidewalls at cathode and anti-cathode side.

Figure 1:
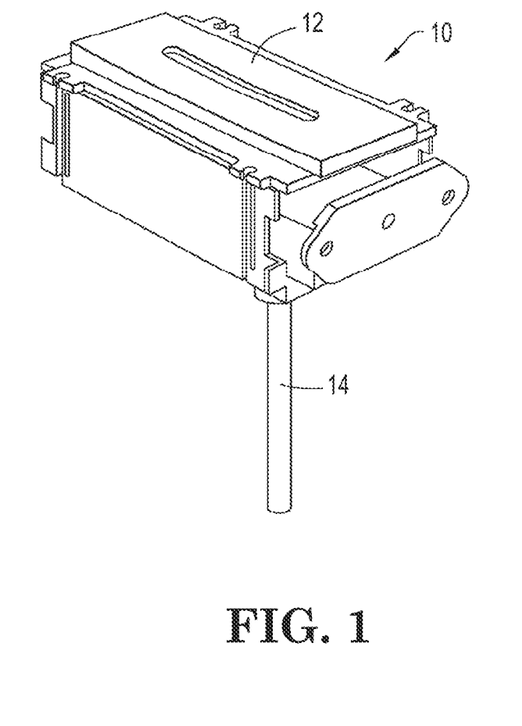
FIG. 1 is a schematic representation of an ion implantation system, including an arc chamber with a gas feed line for feeding dopant source gas to the arc chamber for ionization thereof in the chamber.

Referring now to the drawings, FIG. 1 is a schematic representation of an ion implantation system 10, including an arc chamber 12 with a gas feed line 14 for feeding the fluorine-containing gas to the arc chamber for ionization thereof in the chamber. The arc chamber 12 thus provides an ion source chamber, that includes the graphite-containing material, carbide-containing material, fluoride-containing material, nitride-containing material, oxide-containing material, or ceramic, to reduce the amount of tungsten fluoride formed during an implantation process.

Figure 2:
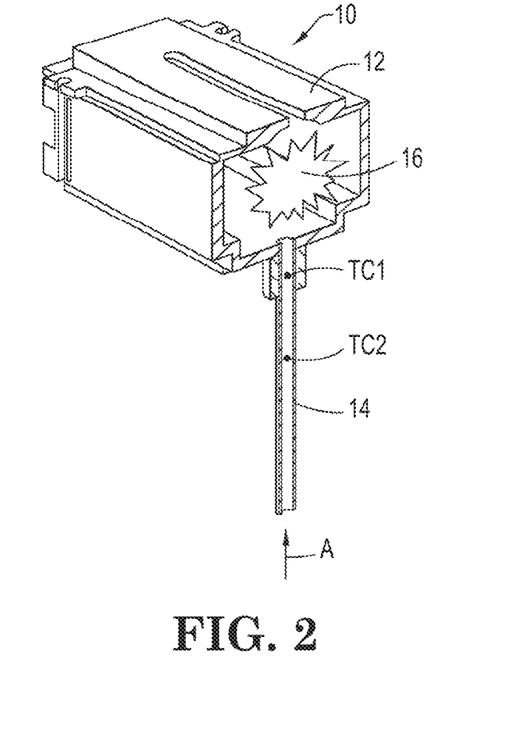
FIG. 2 is a cross section of the FIG. 1 ion implantation system schematically showing the generation of a plasma in the arc chamber of such system.

FIG. 2 is a cross section of the FIG. 1 ion implantation system 10 schematically showing the generation of a plasma 16 in the arc chamber 12 of such system. The fluorine-containing gas is flowed in the direction indicated by arrow A into the fluorine-containing gas feed line 14, having monitoring thermocouples TC1 and TC2 secured thereto in monitoring relationship to determine the quality of the thermal state of the feed line and gas entering the arc chamber, as may be desirable in connection with the use of a thermal management system for the ion implantation system.

Figure 3:
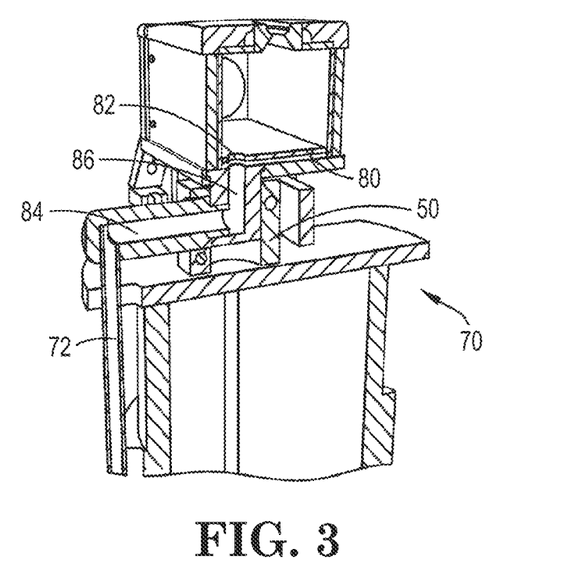
FIG. 3 is a perspective view, in cross-section, of an ion source assembly comprising an ion source apparatus and heat sink apparatus for thermal management of the ion source apparatus.

FIG. 3 is a perspective view, in cross-section, of the ion source assembly comprising the ion source apparatus 70 and an optional heat sink apparatus 50 for thermal management of the system. This cross-sectional view shows the fluorine-containing gas feed line 72 connecting to gas flow passage 84 in the gas feed plug and to the gas flow passage 86 in the gas bushing associated with the ion source.

The ion source apparatus shown in FIG. 3 includes a base 80 that can be coated or modified with the graphite-containing material, a carbide-containing material, a fluoride-containing material, a nitride-containing material, an oxide-containing material, or a ceramic. The base 80 can include an opening 82 therein.

Figure 4:
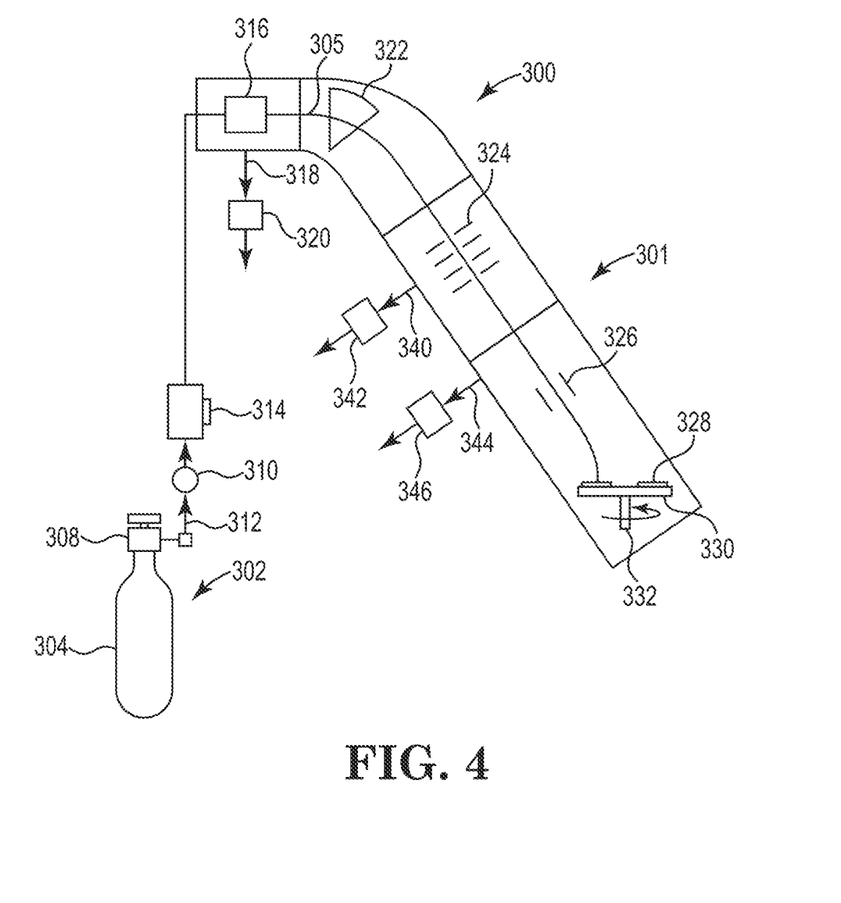
FIG. 4 is a schematic representation of an ion implant process system including a storage and dispensing vessel containing gas which is supplied for ion implantation doping of a substrate in the illustrated ion implant chamber.

FIG. 4 is a schematic representation of an ion implant process system 300 including a storage and dispensing vessel 302 holding a reactant gas which is supplied for in situ reaction with a fluorine-containing gas in the ion source chamber to generate fluorine ionic species for ion implantation of a substrate 328 in the illustrated ion implant chamber 301.

The storage and dispensing vessel 302 comprises a vessel wall 306 enclosing an interior volume holding the fluorine gas.

The vessel may be a gas cylinder of conventional type, with an interior volume arranged to hold only gas, or alternatively, the vessel may contain a sorbent material having sorptive affinity for the reactant gas, and from which the co-reactant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ionizer 316 receiving the dispensed fluorine-containing gas from line 312 that is reactive with the dopant source reactant provided in or in association with the ionizer chamber to generate fluorine ionic species that under the ionization conditions in the ionizer chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form a doped (gallium-doped) substrate as the ion implantation product.

The respective sections of the ion implant chamber 301 are exhausted through lines 318, 340 and 344 by means of pumps 320, 342 and 346, respectively.

In methods of the disclosure one or more fluorine compound(s) that is able to be ionized into fluorine-containing ionic species is used. Exemplary methods for implanting fluorine ions, particularly fluorine ions having two or more fluorine atoms, are described in U.S. Provisional Application entitled, "FLUORINE ION IMPLANTATION METHOD AND SYSTEM" having docket number ENT0188/P1 (E000202), filed concurrently with the present application and wherein its disclosure is incorporated herein by reference.

One type of fluorine compound is represented by compounds having the formula $Q_xF_y$. In $Q_xF_y$, Q is an element capable of forming a bond with fluorine (F), and both x and y are integers that are 1 or greater. In embodiments, x is an integer in the range of 1 to 3, and y is an integer in the range of 1 to 8; in embodiments, x is 1 or 2, and y is an integer in the range of 1 to 6. For some compounds of formula $Q_xF_y$, y is equal to x, for example both y and x are 1. For some compounds of formula $Q_xF_y$, y is greater than x. For example, y is two times x, y is three times x, y is four times x, y is five times x, or y is six times x. For some compounds of formula $Q_xF_y$, y is 1+x, y is 2+x, y is 3+x, y is 4+x, or y is 5+x.

Upon ionization, such as using conditions described herein, compounds having the formula $Q_xF_y$ can generate fluorine ionic species including compounds of formula $Q_uF_v^+$, $F^+$, and $F_2^+$. Both u and v are integers, and can be described in relation to x and y of formula $Q_xF_y$, wherein x is an integer that is greater than or equal to u, and u is an integer that is greater than or equal to 1; and wherein y is an integer that is greater than or equal to v, and v is an integer that is greater than or equal to 1. Accordingly, for ionic species of formula $Q_uF_v^+$, and both u and v are integers that are 1 or greater. In embodiments, u is an integer in the range of 1 to 3, and v is an integer in the range of 1 to 8; in embodiments, u is 1 or 2, and v is an integer in the range of 1 to 6. For some ionic species of formula $Q_uF_v^+$, u is equal to v, for example both u and v are 1. For some ionic species of formula $Q_uF_v^+$, v is greater than u. For example, v is two times u, v is three times u, v is four times u, v is five times u, or v is six times u. For some ionic species of formula $Q_uF_v^+$, v is 1+u, v is 2+u, v is 3+u, v is 4+u, or v is 5+u.

Examples of silicon- and fluorine-containing compounds include those having the formulas $SiF_4$ and $Si_2F_6$, which can be ionized to generate fluorine ionic species, including ionic species selected from the group consisting of $F^+$, $F_2^+$, $SiF^+$, $SiF_2^+$, $SiF_3^+$, $SiF_4^+$, $Si_2F^+$, $Si_2F_2^+$, $Si_2F_3^+$, $Si_2F_4^+$, $Si_2F_5^+$ and $Si_2F_6^+$. In a preferred aspect $SiF_4$ is ionized to generate two or more species selected from the group consisting of $F^+$, $SiF^+$, $SiF_2^+$, $SiF_3^+$, and $SiF_4^+$.

Examples of boron- and fluorine-containing compounds include those of formulas $BF_3$ and $B_2F_4$, which can be ionized to generate fluorine ionic species, including ionic species selected from the group consisting of $F^+$, $F_2^+$, $BF^+$, $BF_2^+$, $BF_3^+$, $B_2^+$, $B_2F_2^+$, $B_2F_3^+$ and $B_2F_4^+$. In a preferred aspect $BF_3$ is ionized to generate two or more species selected from the group consisting of $F^+$, $BF^+$, $BF_2^+$, and $BF_3^+$.

Examples of germanium- and fluorine-containing compounds include those of formulas $GeF_4$ and $Ge_2F_6$, which can be ionized to generate fluorine ionic species, including ionic species selected from the group consisting of $F^+$, $F_2^+$, $GeF^+$, $GeF_2^+$, $GeF_3^+$, $GeF_4^+$, $Ge_2F^+$, $Ge_2F_2^+$, $Ge_2F_3^+$, $Ge_2F_4^+$, $Ge_2F_5^+$ and $Ge_2F_6^+$. In a preferred aspect $GeF_4$ is ionized to generate two or more species selected from the group consisting of $F^+$, $GeF^+$, $GeF_2^+$, $GeF_3^+$, and $GeF_4^+$.

Examples of phosphorus- and fluorine-containing compounds include those of formulas $PF_3$ and $PF_5$, which can be ionized to generate fluorine ionic species, including ionic species selected from the group consisting of $F^+$, $F_2^+$ and $PF^+$, $PF_2^+$, $PF_3^+$, $PF_4^+$, and $PF_5^+$.

Examples of arsenic- and fluorine-containing compounds include those of formulas $AsF_3$ and $AsF_5$, can be ionized to generate fluorine ionic species, including ionic species selected from the group consisting of $F^+$, $F_2^+$ and $AsF^+$, $AsF_2^+$, $AsF_3^+$, $AsF_4^+$, and $AsF_5^+$.

An example of an anitmony- and fluorine-containing compound includes that of formula $SbF_5$, which can be ionized to generate fluorine ionic species, including ionic species selected from the group consisting of $F^+$, $F_2^+$ and $SbF^+$, $SbF_2^+$, $SbF_3^+$, $SbF_4^+$, and $SbF_5^+$.

Examples of tungsten- and fluorine-containing compounds include those of formulas is $WF_6$, which can be ionized to generate fluorine ionic species, including ionic species selected from the group consisting of $F^+$, $F_2^+$ and $WF^+$, $WF_2^+$, $WF_3^+$, $WF_4^+$, $WF_5^+$ and $WF_6^+$.

Examples of nitrogen- and fluorine-containing compounds include those of formulas $NF_3$ and $N_2F_4$, and the fluorine ionic species include two or more species selected from the group consisting of $F^+$, $F_2^+$, $NF^+$, $NF_2^+$, $NF_3^+$, $N_2F^+$, $N_2F_2^+$, $N_2F_3^+$, $N_2F_4^+$, $N_2F_5^+$ and $N_2F_6^+$.

Examples of carbon- and fluorine-containing compounds include those of formulas $CF_4$ and $C_2F_6$, and the fluorine ionic species include two or more species selected from the group consisting of $F^+$, $F_2^+$, $CF^+$, $CF_2^+$, $CF_3^+$, $CF_4^+$, $C_2F^+$, $C_2F_2^+$, $C_2F_3^+$, $C_2F_4^+$ $C_2F_5^+$ and $C_2F_6^+$.

Other types of fluorine-containing compounds that can generate fluorine ionic species include compounds of formula $Q_xR_zF_y$, wherein Q and R are elements capable of forming a bond with fluorine (F), and x, z, and y are integer of 1 or greater. In embodiments Q is selected from the group consisting of B, Si, Ge, P, As, C, and N; and R is selected from H and O. In embodiments, x is an integer in the range of 1 to 3, and is preferably 1 or 2; z is an integer in the range of 1 to 4, and is preferably 1, 2, or 3; and y is an integer in the range of 1 to 8, preferably 1 to 6.

Upon ionization, such as using conditions described herein, compounds having the formula $Q_xR_zF_y$ can generate fluorine ionic species including those of formula $Q_uR_wF_v^+$, $F^+$, and $F_2^+$. All of u, w, and v are integers, and can be described in relation to x, z, and y of formula $Q_xR_zF_y$, wherein x is an integer that is greater than or equal to u, and u is an integer that is greater than or equal to 1; wherein y is an integer that is greater than or equal to v, and v is an integer that is greater than or equal to 1, and wherein z is an integer that is greater than or equal to iv, and iv is an integer that is greater than or equal to 1. Accordingly, for ionic species of formula $Q_uR_wF_v^+$, all of u, iv, and v are integers are 1 or greater. Preferably u is an integer in the range of 1 to 3, and is preferably 1 or 2; iv is an integer in the range of 1 to 4, and is preferably 1, 2, or 3; and v is an integer in the range of 1 to 8, preferably 1 to 6.

Examples of compounds having the formula $Q_xR_zF_y$ include, but are not limited to those such as BHF, $BHF_2$, $SiHF_3$, $SiH_2F_2$, $SiH_3F$, $Si_2H_3F_3$, $Si_2H_5F$, $Si_2HF_5$, $GeHF_3$, $GeH_2F_2$, $GeH_3F$, $PHF_2$, $PH_2F$, $PH_3F_2$, $P_2HF$, $ASHF_2$, $ASH_2F$, $ASH_3F_2$, $C_nH_xF_{2n+2-x}$, $C_nH_xF_{2n-x}$, $C_nH_xF_{2n-2-x}$, $COF_2$, $NHF_2$, $NH_2F$, NHF, and $N_2H_3F$, wherein n is an integer in the range of 1-3, and x is 0, 1, or 2.

Other types of fluorine-containing compounds that can generate fluorine ionic species include compounds of formula $F_y$, and the fluorine ionic species includes r and a compound of formula $F_v^+$, wherein y is an integer that is greater than or equal to v, and v is an integer that is greater than or equal to 1.

Methods of the disclosure can also include use of a mixture of two or more fluorine compounds of formulas $Q_xF_y$, $Q_xR_zF_y$, and $F_y$. If two or more different fluorine-containing compounds are used, these may be flowed into the implantation chamber independently, or can be flowed as a mixture into the chamber.

In methods of the disclosure, the one or more fluorine-containing compounds are flowed into the implantation chamber to generate fluorine ionic species. In some embodiments, the fluorine ionic species can include a species with the greatest number of fluorine atoms (a "cluster ion"), and the flow rate, arc power and source magnet field are chosen so the species with the greatest number of fluorine atoms has a beam current that is greater than beam current(s) of specie(s) having a fewer number of fluorine atoms.

Operation of the system for fluorine ion implantation can be described in terms of arc power and arc voltage. In some modes of practice, the system is operated to provide an arc power in the range of about 5 W to about 1500 W, or in some modes of practice an arc power is in the range of about 90 W to about 1000 W. In order to achieve an arc power in one of these ranges, the system can be operated so arc power is generated at an arc voltage in the range of about 30 V to about 150 V, or more specifically is in the range of about 60 V to about 125 V.

Operation of the system for fluorine ion implantation can also be described in terms of the flow rate of the fluorine-containing compound into the ion implantation chamber. In some embodiments, fluorine-containing compound is flowed into the chamber at a rate not greater than 10 sccm, and in embodiments, the fluorine-containing compound is flowed at a rate in the range of 0.2 sccm to 6 sccm.

In some specific modes of practice the fluorine compound is $BF_3$, and the fluorine ionic species include two or more species selected from the group consisting of $F^+$, $BF^+$, $BF_2^+$, and $BF_3^+$; the arc power is in the range of 350 W to 1500 W which is generated at an arc voltage in the range of 30 V to 150 V, and the flow rate is in the range of 1.25 sccm to 1.75 sccm.

In some specific modes of practice the fluorine compound is $SiF_4$, and the fluorine ionic species include two or more species selected from the group consisting of $F^+$, $SiF^+$, $SiF_2^+$, $SiF_3^+$, and $SiF_4^+$; the arc power is in the range of 50 W to 1500 W which is generated at an arc voltage in the range of 30 V to 150 V, and the flow rate is in the range of 1.0 sccm to 1.5 sccm.

In some specific modes of practice the fluorine compound is $GeF_4$, and the fluorine ionic species include two or more species selected from the group consisting of $F^+$, $GeF^+$, $GeF_2^+$, $GeF_3^+$, and $GeF_4^+$; the arc power is in the range of 50 W to 1500 W which is generated at an arc voltage in the range of 30 V to 150 V, and the flow rate is in the range of 0.2 sccm to 0.8 sccm.

Optionally, methods of the disclosure can include flowing a (non-fluorinated) hydrogen- or hydride-containing compound which is different than the fluorine compound, to the ion implanter. Examples of such compounds include, but are not limited to, compound compounds such as $H_2$, $B_2H_6$, $SiH_4$, $Si_2H_6$, $GeH_4$, $Ge_2H_6$, $PH_3$, $AsH_3CH_4$, $C_2H_6$, $C_xH_y$ (where x and y are equal or more than 1), $NH_3$ and $N_2H_4$. In exemplary modes of practice, the hydrogen-or hydride-containing compound is flowed into the arc chamber at a rate from 0.05 sccm to 10 sccm.

Optionally, methods of the disclosure can include flowing a (non-fluorinated) oxygen-containing compound which is different than the fluorine compound, to the ion implanter. Examples of such compounds include, but are not limited to, compound compounds such as $O_2$, $O_3$, $H_2O$, $H_2O_2$, CO, $CO_2$, NO, $NO_2$, $N_2O$, $N_4O$, $N_2O_3$, $N_2O_4$, $N_2O_5$ and $N_2O_6$.

Optionally, methods of the disclosure can include flowing an inert gas to the ion implanter. Examples of inert gases include nitrogen, helium, neon, argon, krypton, and xenon.

In modes of practice one of hydrogen-or hydride-containing gas, oxygen-containing gas, or inert gas is flowed to the implanter along with the fluorine-containing compound; in other modes of practice two of the gases are flowed; and in yet other modes of practice all three gases are flowed to the implanted along with the fluorine-containing compound.

If more than one gas is flowed to the chamber the gases can be flowed individually. Alternatively, the gases can be flowed in mixture. For example, any two or more of the fluorine-containing, hydrogen-containing, oxygen-containing and/or inert gases can be pre-mixture in gas cylinder package. In yet other embodiments, two or more gases are in mixture and then another gas is individually flowed to the chamber.

EXAMPLE 1

Figure 5:
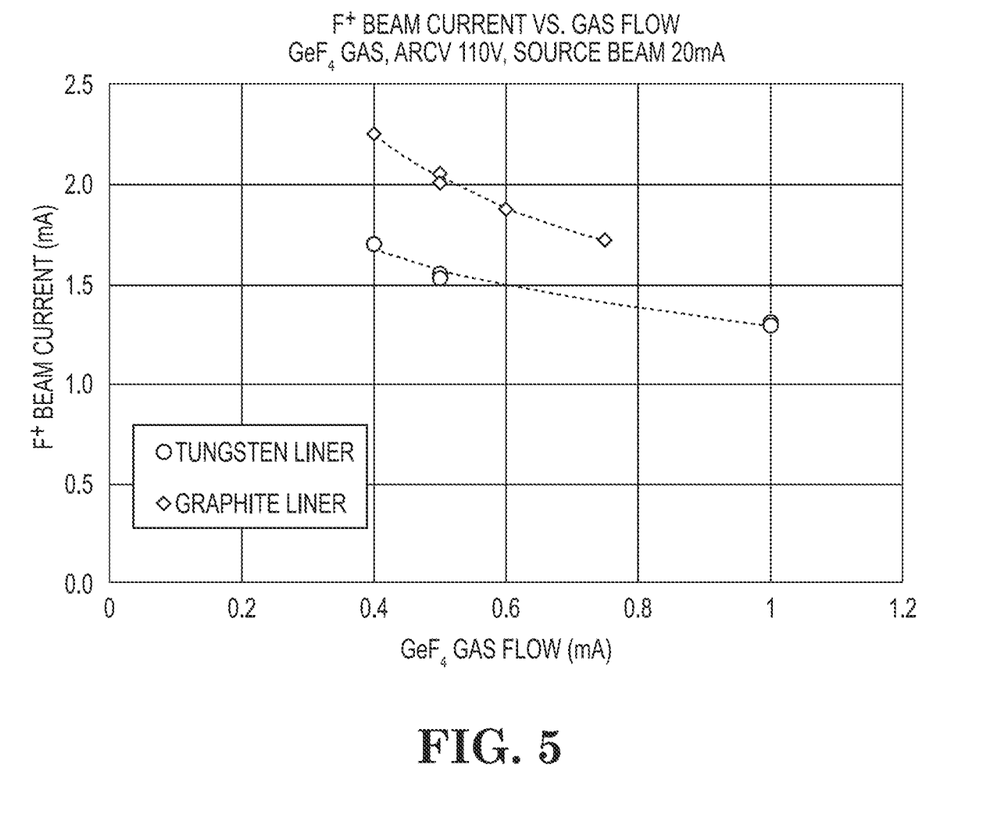
FIG. 5 shows $F^+$ beam current data from experiments using a $GeF_4$ gas in the presence of a tungsten liner versus a graphite liner.

A fluorine-containing gas, $GeF_4$, was flowed into an ionization chamber having a tungsten liner and an ionization chamber having a graphite liner. The system was operated at an arc voltage of 110V and source beam of 20 mA. F+ ion beam current was measured at various gas $GeF_4$ flow rates. At each flow rate tested, the system with the graphite liner provided a higher $F^+$ beam current as compared to the system with the tungsten liner. Results are shown in FIG. 5.

EXAMPLE 2

Figure 6:
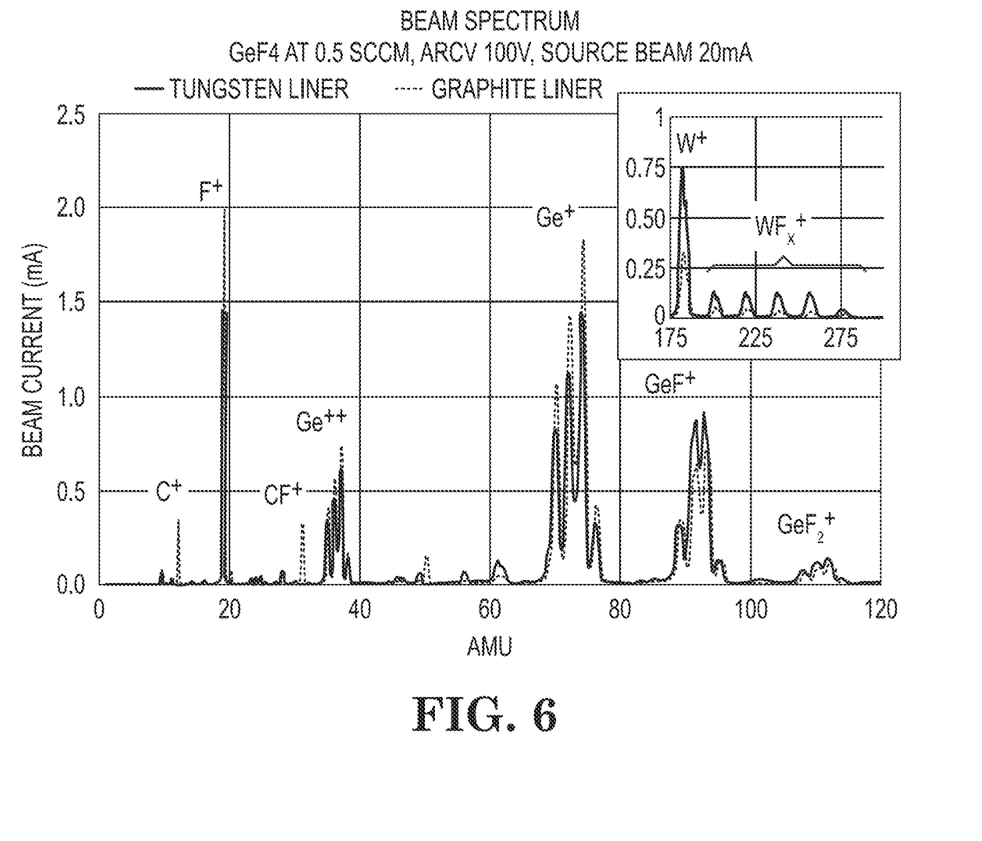
FIG. 6 shows ionized species from experiments using $GeF_4$ gas and lower $W^+$ and $WF_x^+$ beams when the graphite liners were used.

The beam spectrums of various ionized species resulting from the processes described in Example 1 were determined. Results show that from the $GeF_4$ beam spectrum, significantly lower W+ and WF$_x$+ beams were observed when the graphite liners were used. See FIG. 6.

EXAMPLE 3

Figure 7:
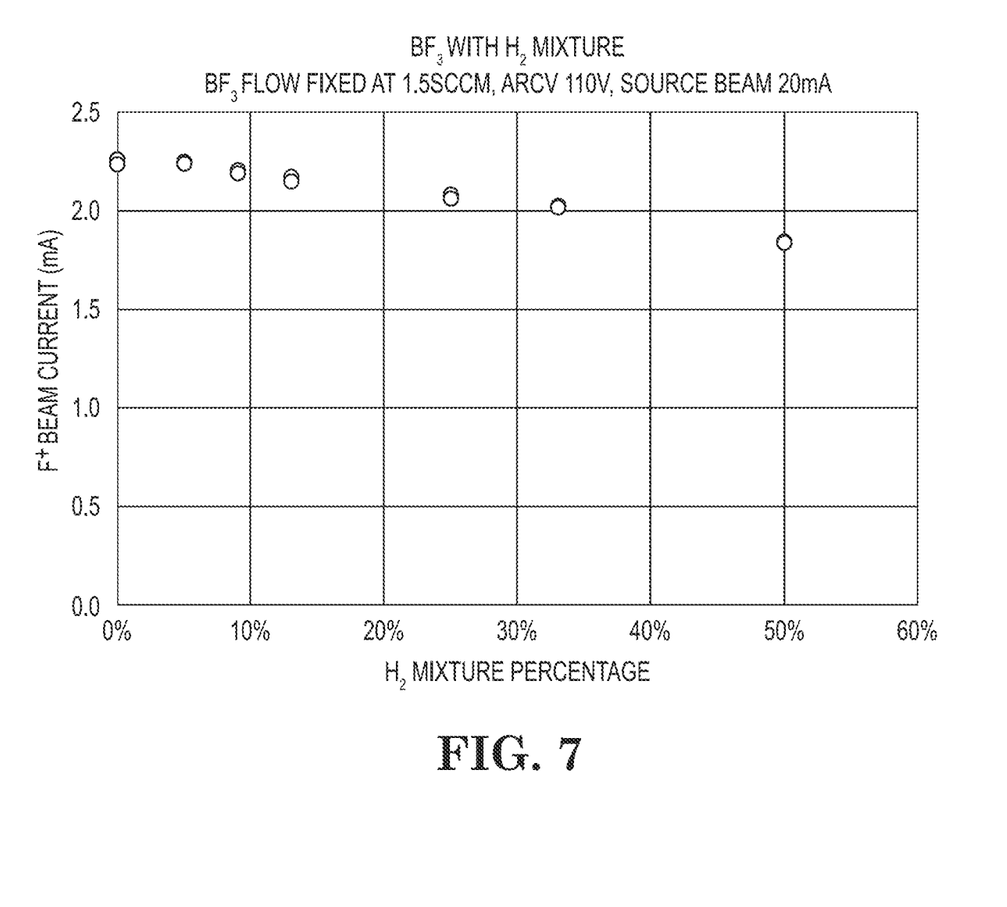
FIG. 7 shows $F^+$ beam current data from experiments using mixtures of $BF_3$ and $H_2$ gases.
Figure 8:
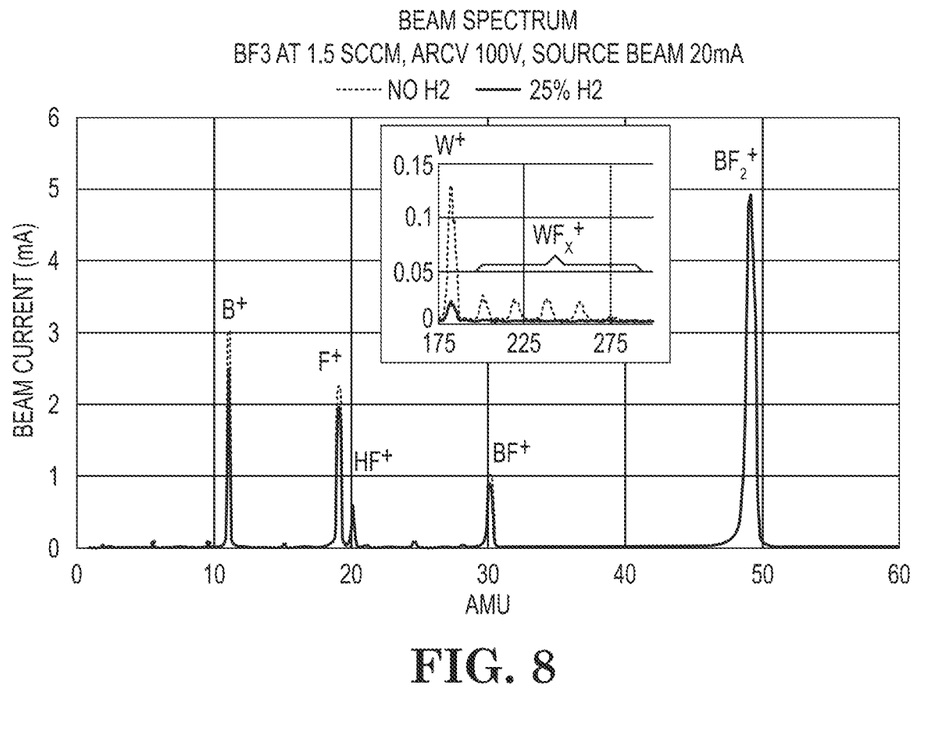
FIG. 8 shows ionized species from experiments using $BF_3/H_2$ mixture gases and lower $W^+$ and $WF_x^+$ beams when $H_2$ was mixed with the $BF_3$ gas.

A fluorine-containing gas, BF$_3$, was flowed into an ionization chamber alone and with the presence of hydrogen gas (H$_2$). The flow rate of BF$_3$, was at 1.5 sccm, and the system was operated at an arc voltage of 110V and a source beam of 20 mA. FIG. 7 shows the F+ beam current at increasing concentrations of H$_2$, revealing that the current is only slightly affected when the H$_2$ was increased up to 50%. However, when the BF$_3$ beam spectrum of ionized species was analyzed, it showed a significant reduction in W+ and WF$_x$+ beams when H$_2$ was mixed with BF$_3$. See FIG. 8.

What is claimed is:

1. A system for implanting fluorine ion species into a substrate, the system comprising:
   a gas source comprising a fluorine compound, wherein the fluorine compound is capable of generating at least one fluorine ion species when ionized; and
   an arc chamber comprising arc chamber piece(s) with one or more materials, wherein the one or more materials comprises a graphite-containing material, a carbide-containing material, a fluoride-containing material, a nitride-containing material, an oxide-containing material, or a ceramic, and wherein the arc chamber piece(s) are surface graded with the one or more materials, whereby surface grading is achieved by applying at least one of the one or more materials to the arc chamber piece(s) and then integrating the one or more materials into the arc chamber piece(s).

2. The system of claim 1, wherein the graphite-containing material, the carbide-containing material, the fluoride-containing, the nitride-containing, the oxide-containing material, or the ceramic are selected from a group consisting of graphite (C), silicon carbide (SiC), tungsten carbide (WC), tungsten boride (WB, W$_2$B, WB$_2$, and/or WB$_4$), boron carbide (B$_4$C, and/or B$_{12}$C$_3$), calcium carbide (CaC$_2$), aluminum carbide (Al$_4$C$_3$), magnesium carbide (Mg$_2$C), aluminum fluoride (AlF$_3$), gallium fluoride(GaF$_3$), indium fluoride (InF$_3$), boron nitride (BN), gallium nitride (GaN), aluminum nitride (AlN), tungsten lanthanum oxide (WLa$_2$O$_3$), gallium oxide (Ga$_2$O$_3$), and aluminum oxide (Al$_2$O$_3$).

3. The system of claim 1, wherein the graphite-containing material, the carbide-containing material, or the ceramic are selected from a group consisting of 10 micron graphite, 5 micron graphite, DFP3-densified graphite, hard graphite, hard 5 micron graphite with pyrocarbon coating, hard 5 micron graphite with pyrocarbon infiltration, hard 1 micron graphite, hard 1 micron graphite with pyrocarbon coating, hard 1 micron graphite with pyrocarbon infiltration, graphite with SiC composite layer, and a combination of any two or more of these materials.

4. A system for implanting fluorine ion species into a substrate, the system comprising:
   a gas source comprising a fluorine compound, wherein the fluorine compound is capable of generating at least one fluorine ion species when ionized; and
   an arc chamber comprising interior surfaces,
      wherein all or a portion of the interior surfaces comprises removable arc chamber liner(s),
      wherein the removable arc chamber liner(s) are configured to be removed and inserted from the interior space of the arc chamber,
      wherein the removeable arc chamber liner(s) are surface graded with a graphite-containing material, a carbide-containing material, a fluoride-containing, a nitride-containing, an oxide-containing material, or a ceramic, and
      wherein the surface grading is achieved by applying the graphite-containing material, the carbide-containing material, the fluoride-containing, the nitride-containing, the oxide-containing material, or the ceramic to the arc chamber liner(s) and then integrating into the arc chamber liner(s).

5. The system of claim 4, wherein
   (a) the fluorine compound has formula Q$_x$F$_y$, wherein Q is an element capable of forming a bond with fluorine (F), and is capable of forming fluorine ionic species including a compound of formula Q$_u$F$_v$+, F+ and F$_2$+, wherein x is an integer that is greater than or equal to u, and u is an integer that is greater than or equal to 1; wherein y is an integer that is greater than or equal to v, and v is an integer that is greater than or equal to 1;
   (b) the fluorine compound has formula Q$_x$R$_z$F$_y$, wherein Q and R are elements capable of forming a bond with fluorine (F), and capable of forming fluorine ionic species including a compound of formula Q$_u$R$_w$F$_v$+, F+ and F$_2$+, wherein x is an integer that is greater than or equal to u, and u is an integer that is greater than or equal to 1; wherein y is an integer that is greater than or equal to v, v is an integer that is greater than or equal to 1, and wherein z is an integer that is greater than or equal to w, and w is an integer that is greater than or equal to 1;
   (c) the fluorine compound has formula F$_y$, and the fluorine ionic species includes a compound of formula F$_v$+, wherein y is an integer that is greater than or equal to v, and v is an integer that is greater than or equal to 1; or
   (d) a mixture of any two of more of compounds of formulas Q$_x$F$_y$, Q$_x$R$_z$F$_y$ and F$_y$.

6. The system of claim 5, wherein the fluorine compound is selected from the group consisting of F$_2$, BF$_3$, BHF, BHF$_2$, B$_2$F$_4$, SiF$_4$, Si$_2$F$_6$, SiHF$_3$, SiH$_2$F$_2$, SiH$_3$F, Si$_2$H$_3$F$_3$, Si$_2$H$_5$F, Si$_2$HF$_5$, GeF$_4$, Ge$_2$F$_4$, Ge$_2$F$_6$, GeHF$_3$, GeH$_2$F$_2$, GeH$_3$F, PF$_3$, PF$_5$, PHF$_2$, PH$_2$F, PH$_3$F$_2$, P$_2$HF, AsF$_3$, AsF$_5$, AsHF$_2$, AsH$_2$F, AsH$_3$F$_2$, SbF$_3$, SbF$_5$, XeF$_2$, XeF$_4$, XeF$_6$, WF$_6$, MoF$_6$, C$_n$F$_{2n+2}$, C$_n$F$_{2n}$, C$_n$F$_{2n-2}$, C$_n$H$_x$F$_{2n+2-x}$, C$_n$H$_x$F$_{2n-x}$, C$_n$H$_x$F$_{2n-2-x}$, COF$_2$, SF$_6$, SF$_4$, SeF$_6$, NF$_3$, N$_2$F$_4$, NHF$_2$, NH$_2$F, NHF, N$_2$H$_3$F and HF, wherein n is 1, 2, or 3, and x is 0, 1, or 2.

7. The system of claim 4, further comprising a hydrogen- or hydride-containing gas source selected from the group consisting of H$_2$, B$_2$H$_6$, SiH$_4$, Si$_2$H$_6$, GeH$_4$, Ge$_2$H$_6$, PH$_3$, AsH$_3$CH$_4$, C$_2$H$_6$, C$_x$H$_y$ (where x and y are equal or great than 1), NH$_3$, and N$_2$H$_4$.

8. The system of claim 4, further comprising an oxygen-containing gas source selected from the group consisting of O$_2$, O$_3$, H$_2$O, H$_2$O$_2$, CO, CO$_2$, NO, NO$_2$, N$_2$O, N$_4$O, N$_2$O$_3$, N$_2$O$_4$, N$_2$O$_5$, and N$_2$O$_6$.

9. The system of claim 4, further comprising an inert gas source selected from the group consisting of nitrogen, helium, neon, argon, krypton, and xenon.

10. A method for implanting one or more fluorine ion species, the method comprising:
   providing a system wherein the system comprises
      a gas source, wherein the gas source comprising a fluorine compound, and wherein the fluorine compound is capable of generating at least one fluorine ion species when ionized;

an arc chamber comprising arc chamber piece(s) with at least three materials,
wherein the at least three materials comprise a graphite-containing material, a carbide-containing material, a fluoride-containing material, a nitride-containing material, an oxide-containing material, or a ceramic,
wherein the arc chamber piece(s) are surface graded with the at least three materials, whereby surface grading is achieved by applying at least one of the at least three materials to the arc chamber piece(s) and then integrating at least one of the at least three materials into the arc chamber piece(s); and
a substrate presented in the arc chamber; and
operating the system to implant the one or more fluorine ion species into the substrate.

11. The method of claim 10, wherein
the system comprises a tungsten arc chamber liner(s) and the arc chamber piece(s);
the operating of the system generates tungsten fluoride; and
the one or more materials reduces formation of tungsten fluoride in the arc chamber and improves fluorine ion species beam current, improves source life, or both.

12. The method of claim 10, wherein the method further comprises
flowing the fluorine compound into the arc chamber at a predetermined flow rate; and
generating the fluorine ionic species from the fluorine compound at a predetermined arc power and source magnet field,
wherein the fluorine ionic species comprise a desired fluorine ionic specie for substrate implantation; and
wherein the predetermined flow rate, arc power and source magnet field are chosen to provide an optimized beam current for the desired fluorine ionic specie.

13. The method of claim 10, wherein the desired fluorine ionic specie comprises F+ion.

14. The method of claim 12, wherein the desired fluorine ionic specie is implanted in the substrate at a desired depth by the selected energy and using the predetermined flow rate, arc power and source magnet field.

15. The method of claim 12, wherein the predetermined arc power is in the range of 5 W to 1500 W.

16. The method of claim 12, wherein the predetermined arc power is generated at an arc voltage in the range of 30 V to 150 V.

17. The method of claim 12, wherein the predetermined flow rate is in the range of 0.2 sccm to 10 sccm.

18. The method of claim 10, further comprising flowing a hydrogen- or hydride-containing gas to the arc chamber at a rate from 0.05 sccm to 10 sccm.

19. The system of claim 1, wherein the arc chamber comprising at least three materials selected from a group consisting of a graphite-containing material, a carbide-containing material, a fluoride-containing material, a nitride-containing material, an oxide-containing material, or a ceramic.

* * * * *